United States Patent [19]

Weber

[11] Patent Number: 5,169,549
[45] Date of Patent: Dec. 8, 1992

[54] METHOD OF PRODUCING NICKEL SHELL MOLDS

[75] Inventor: Reinhart Weber, Midland, Canada

[73] Assignee: Nickel Tooling Technology Inc., Midland, Canada

[21] Appl. No.: 723,030

[22] Filed: Jun. 28, 1991

[30] Foreign Application Priority Data

Jun. 28, 1990 [GB] United Kingdom ............... 9014430

[51] Int. Cl.$^5$ .................... B29C 33/02; B28B 7/34
[52] U.S. Cl. .................... 249/80; 249/114.1; 249/134; 249/135; 425/384; 425/407; 425/547; 425/552
[58] Field of Search ............ 249/134, 135, 79, 80, 249/81, 114.1, 115, 116; 264/219; 425/547, 552, 384, 407

[56] References Cited

U.S. PATENT DOCUMENTS

| | | |
|---|---|---|
| 2,317,597 | 4/1943 | Ford et al. ............... 249/79 |
| 2,579,898 | 12/1951 | Brucker ............... 249/114.1 |
| 2,907,070 | 10/1959 | Van Hartesveldt ............... 249/80 |
| 3,638,299 | 2/1972 | Garner et al. ............... 249/80 |
| 4,063,705 | 12/1977 | Vodra ............... 249/80 |
| 4,659,056 | 4/1987 | Michaud-Soret ............... 249/134 |

FOREIGN PATENT DOCUMENTS 61-127886 6/1987 Japan ............... 249/79

Primary Examiner—Jay H. Woo
Assistant Examiner—Khanh P. Nguyen
Attorney, Agent, or Firm—Arne I. Fors

[57] ABSTRACT

A nickel shell for molds formed by nickel vapor deposition having incorporated therein a combination steel parting line and manifold and a plurality of heating and cooling lines operatively connected to the manifold for the flow of heating or cooling fluid therethrough, said heating and cooling lines, and other mold components such as injection nozzles and mold vents, being encapsulated within the nickel shell.

5 Claims, 3 Drawing Sheets

1

METHOD OF PRODUCING NICKEL SHELL MOLDS

BACKGROUND OF THE INVENTION

This invention relates to novel molds made of nickel shells by direct nickel vapour deposition and, more particularly, relates to molds made of nickel shells by nickel vapour deposition wherein said molds have steel parting line components and heating and cooling lines encapsulated within the nickel shells.

The production of nickel molds by the electrodeposition of nickel on cathodes of desired shapes is well known. Typical nickel shapes produced by electrodeposition do not have uniform thickness, particularly at right-angled joints, with the result that flanges, for example, are weak and often break. Electrodepositions are also prone to voids and residual stresses. In addition, the electrodeposition of nickel on a cathode to form a nickel shell of desired thickness normally takes an inordinately long time, resulting in low production rates with high expense.

The forming of nickel shells for molds by nickel vapour deposition on mandrels is known. Nickel vapour in the form of nickel carbonyl gas is passed over a heated mandrel in a deposition chamber and, as the nickel carbonyl gas contacts the hot mandrel surface, it decomposes to form a hard and dense nickel deposit. The deposited nickel as a layer accurately reproduces the surface details of the mandrel on which it is deposited. The nickel layer is uniformly deposited on the mandrel, regardless of shape, thereby producing adequate thickness in irregular shapes such as at sharp corners.

The nickel metal is deposited relatively quickly permitting the production of nickel shells with desired thickness in a relatively short period of time compared to electrodeposition.

SUMMARY OF THE INVENTION

It has been found that nickel shells produced by nickel vapour deposition can be incorporated with peripheral steel frames which function as parting lines and as manifolds for heating and cooling lines which are encapsulated within the body of the nickel shell for effective heat transfer and for the provision of structural strength to the shell.

In its broadest concept, the invention is directed to a nickel shell mold formed by nickel vapour deposition having incorporated therein a combination steel parting line and manifold on which the nickel is deposited and a plurality of heating and cooling lines operatively connected to the combination steel manifold for the flow of fluid therethrough, said heating and cooling lines also being encapsulated within the nickel shell.

Other mold components, such as steel injection nozzles and venting apparatus, can also be encapsulated within the nickel shell mold. Encapsulation provides strength, rigidity and dimensionally accurate net location without the need for subsequent machining.

BRIEF DESCRIPTION OF THE DRAWINGS

The nickel shell mold of the present invention will now be described with reference to the accompanying drawings, in which.

DESCRIPTION OF THE PREFERRED EMBODIMENT

Figure 1:
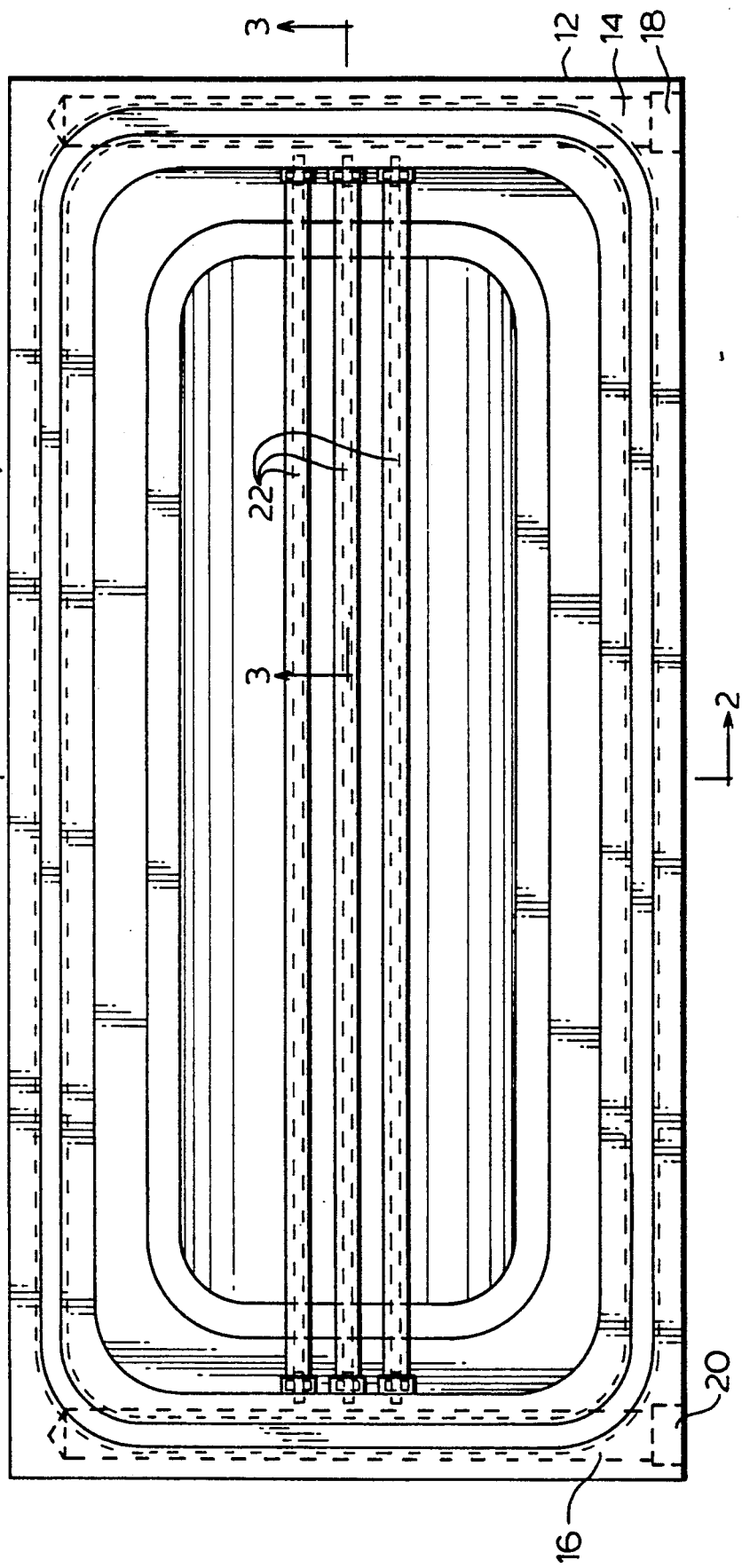
FIG. 1 is a plan view of a nickel shell mold of the invention showing the nickel shell with peripheral combination steel manifold and parting lines and longitudinal heating and cooling lines connected to said combination steel manifold and parting line.

With reference to the drawings, a nickel shell mold of the present invention designated by numeral 10 comprises a steel peripheral parting line 12 surrounding the mold 10 having manifolds 14, 16 formed in opposite ends thereof. A threaded female manifold connection 18 is provided at the feed end of the manifold and a threaded female manifold connection 20 is provided at the discharge end of the manifold for ingress and egress of heating or cooling fluids. Manifold 14 is interconnected with manifold 16 by a plurality of heating and cooling lines or tubes 22, three of which are shown in FIG. 21 for illustration purposes.

Figure 3:
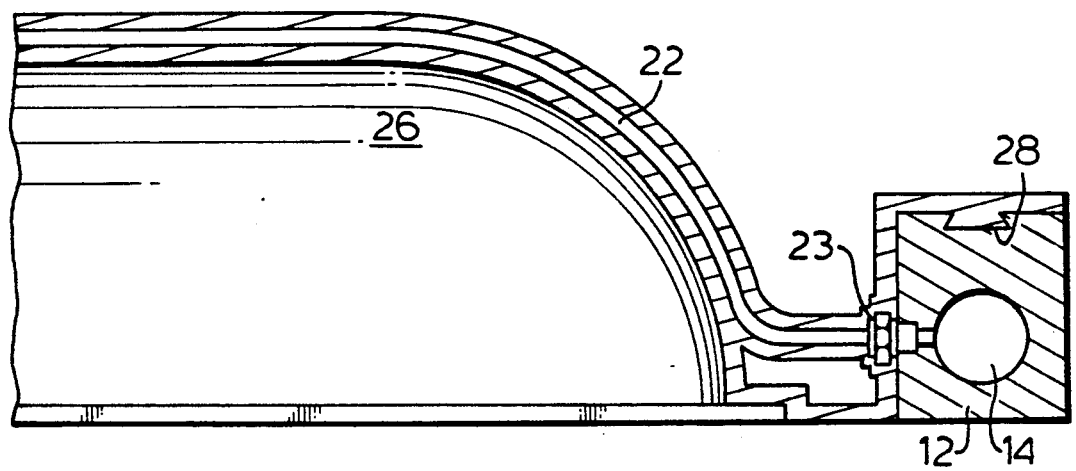
FIG. 3 is a section taken along 3—3 of FIG. 1 showing a portion of a heating and cooling line connected to a combination steel manifold and parting line.

With reference now to FIG. 3, a tube 22, preferably formed of copper or stainless steel, is connected to steel manifold and parting line 12 by a commercially available fitting such as a swagelock fitting 23. Tube 22 is bent to follow the contour of the mandrel on which the nickel shell 11 is formed, the inner side of which is typified by numeral 26, and is spaced a uniform distance in proximity to the mandrel. Combination steel manifold and parting line 12 preferably has dovetail grooves 28 formed therein to intimately key the nickel shell thereto.

Figure 2:
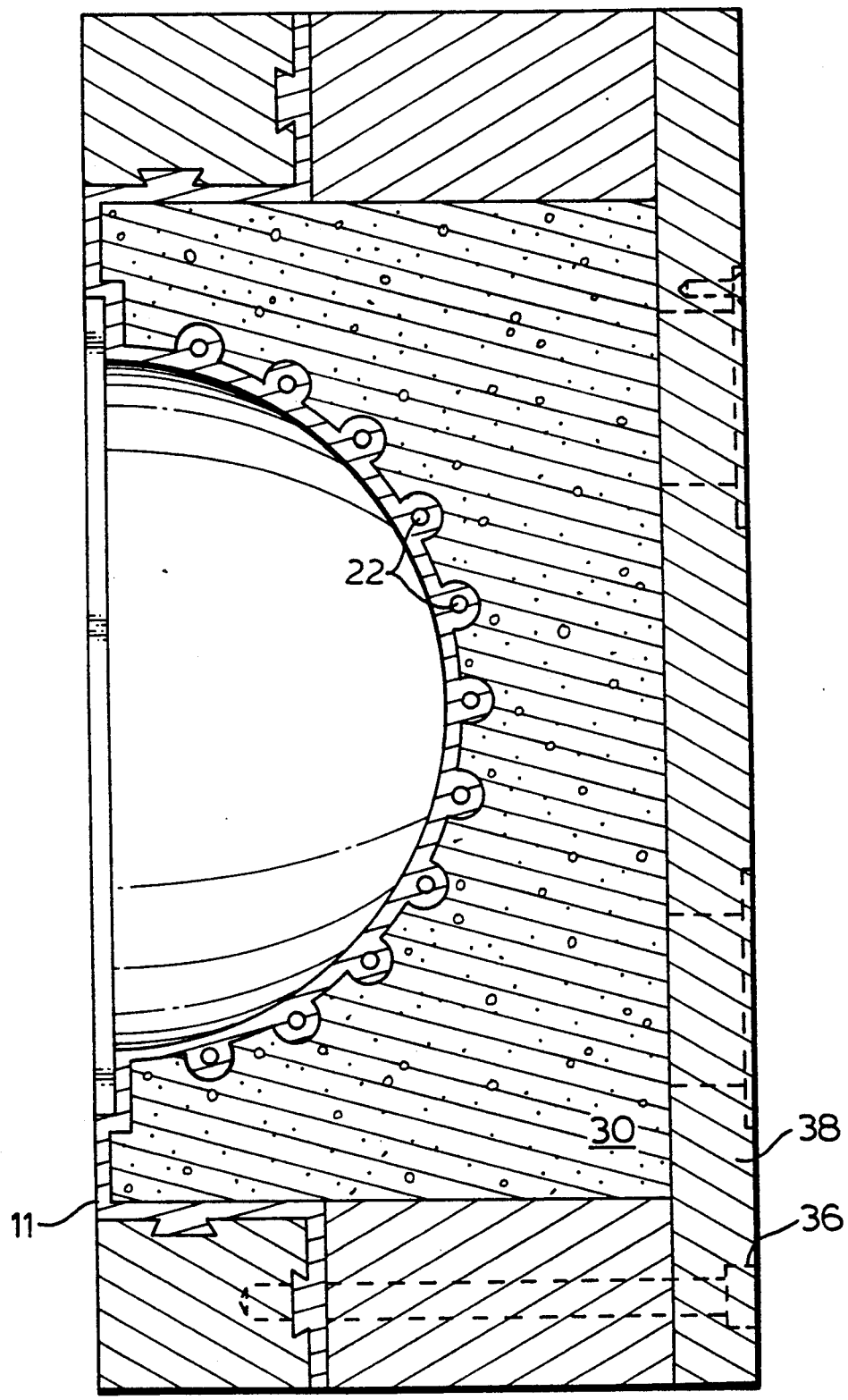
FIG. 2 is a section taken along 2—2 of FIG. 1 showing the nickel shell with the heating and cooling lines encapsulated therein.
Figure 4:
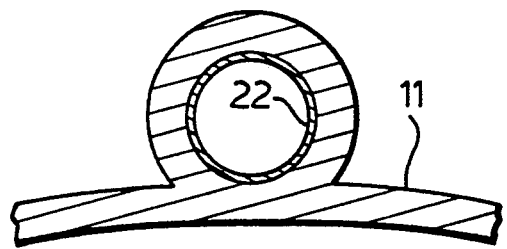
FIG. 4 is an enlargement of a heating and cooling tube encapsulated in the nickel shell.

Turning to FIG. 2 and 4, it will be evident that a plurality of heating and cooling tubes 22 are uniformly spaced about and encapsulated into the body of the nickel shell mold 11 for effective heat transfer.

In the manufacture of the nickel shells molds, mandrels made out of metal or high temperature resins having the desired mold shape are placed in a deposition chamber in abutment with a combination steel manifold and parting line having the plurality of heating and cooling tubes connected thereto. The heating and cooling tubes are bent to conform to the shape of the mandrel and are spaced in uniform proximity thereto such that the deposition of nickel on the mandrel by the nickel vapour deposition process will encapsulate the tubes and the exposed portions of the combination steel manifold and parting line for embedment in the dovetail recesses to form an integral structure therewith. The rear of the nickel shell can be backed with a filler material such as concrete or epoxy 30 to provide additional rigidity thereto. The filler material 30 becomes keyed onto shell 11 encapsulating tubes 22 to prevent delamination of the shell from the filler material.

A plurality of bolts 36, one of which is shown in FIG. 2, fastens the nickel shell 10 to the mold support structure 38.

The mold of the present invention has a number of advantages. The encapsulation of the steel parting line and manifold and interconnecting heating and cooling line in the nickel shell provides rigidity to the nickel shell and prevents deformation thereof. The mold backing is effectively keyed onto the nickel shell by keying onto the encapsulated heating and cooling tubes. The encapsulated steel parting line provides an accurate alignment of the nickel shells with other mold frame components. The integration of the steel parting line into the mold is accomplished without machining subsequent to the deposition of the nickel shell and hence reduces production time and expense. The steel parting line also provides for superior wear resistance and dimensional stability.

The encapsulation of heating and cooling lines during the nickel vapour deposition process provides substantially enhanced transfer of heat for heating and cooling of the shell during its use as a mold such as for example in rotational molding where it is important to provide heat during molding and to rapidly chill the mold upon completion of molding. The complete encapsulation of heating and cooling tubes and their fittings with the steel manifold prevents leakage and negates the undesirable results from corrosion of the tubes such as copper lines.

It will be understood, of course, that modifications can be made in the embodiment of the invention illustrated and described herein without departing from the scope and purview of the invention as defined by the appended claims.

I claim:

1. A nickel shell mold formed by nickel deposition comprising a nickel shell having a desired configuration, a peripheral steel parting line surrounding said shell, means integrally securing said shell to the parting line, said parting line having a manifold formed at each end of the mold extending substantially across the width of the mold, connection means formed in each manifold for receiving external fluid lines, a plurality of fluid lines having the configuration of the mold extending across the mold from one manifold to the other for communicating heating or cooling fluid from one manifold to the other, said plurality of fluid lines and adjacent portions of the manifolds being encapsulated into the body of the nickel shell for efficient heat transfer.

2. A nickel shell mold as claimed in claim 1 which said plurality of fluid lines are copper or stainless steel.

3. A nickel shell mold as claimed in claim 2 in which said plurality of fluid lines is connected to the manifolds by swagelock fittings.

4. A nickel shell mold as claimed in claim 3 in which the means for rigidly securing the shell to the steel parting line are dovetail connections.

5. A nickel shell mold as claimed in claim 4 additionally comprising a backing filler of material keyed onto the plurality of fluid lines to prevent delamination of the filler material from the nickel shell.

* * * * *